(12) United States Patent
Takeuchi et al.

(10) Patent No.: US 8,590,386 B2
(45) Date of Patent: *Nov. 26, 2013

(54) PRESSURE DETECTION DEVICE AND PRESSURE DETECTION METHOD

(75) Inventors: Kesatoshi Takeuchi, Shiojiri (JP); Yojiro Okakura, Suwa (JP)

(73) Assignee: Seiko Epson Corporation (JP)

( * ) Notice: Subject to any disclaimer, the term of this patent is extended or adjusted under 35 U.S.C. 154(b) by 170 days.

This patent is subject to a terminal disclaimer.

(21) Appl. No.: 13/081,730

(22) Filed: Apr. 7, 2011

(65) Prior Publication Data

US 2011/0184557 A1  Jul. 28, 2011

Related U.S. Application Data

(63) Continuation of application No. 12/393,530, filed on Feb. 26, 2009, now Pat. No. 7,992,444.

(30) Foreign Application Priority Data

Feb. 28, 2008 (JP) ................................. 2008-048557
Jan. 22, 2009 (JP) ................................. 2009-011653

(51) Int. Cl.
*G01L 9/10* (2006.01)
(52) U.S. Cl.
USPC ............................................. 73/722; 73/728
(58) Field of Classification Search
USPC ................................................. 73/700–756
See application file for complete search history.

(56) References Cited

U.S. PATENT DOCUMENTS

| | | | |
|---|---|---|---|
| 4,936,148 A | 6/1990 | Shaw et al. |
| 6,182,514 B1 | 2/2001 | Hodges |
| 6,439,538 B1 | 8/2002 | Ito |
| 7,663,362 B2 | 2/2010 | Kishida et al. |
| 2007/0279049 A1 | 12/2007 | Johnson |
| 2008/0258718 A1 | 10/2008 | Pullini |

FOREIGN PATENT DOCUMENTS

| | | |
|---|---|---|
| CN | 2241875 Y | 12/1996 |
| JP | 07-253374 | 10/1995 |
| JP | 09-072803 | 3/1997 |
| JP | 10-170377 | 6/1998 |
| JP | 2001-104471 | 4/2001 |
| JP | 2004-012331 | 1/2004 |
| JP | 2005-037264 | 2/2005 |
| JP | 2006-182209 | 7/2006 |
| JP | 2007-040956 | 2/2007 |
| JP | 2008-020239 | 1/2008 |
| JP | 2008-039659 | 2/2008 |

*Primary Examiner* — Andre Allen
(74) *Attorney, Agent, or Firm* — Harness, Dickey & Pierce, P.L.C.

(57) ABSTRACT

A pressure detection device includes a buffer member and a sensor assembly. The buffer member is deformable by a pressure change, and includes a plurality of magnets in an evenly dispersed arrangement. The sensor assembly includes at least one magnetic sensor to detect a variation of a magnetic field accompanied by deformation of the buffer member.

13 Claims, 21 Drawing Sheets

|  |  | ROW | | | | |
|---|---|---|---|---|---|---|
|  |  | 1 | 2 | 3 | 4 | 5 |
| COLUMN | 1 | 0 | 0 | 0 | 0 | 0 |
|  | 2 | 0 | −0.1 | −0.3 | −0.1 | 0 |
|  | 3 | 0 | −0.2 | −0.4 | −0.2 | 0 |
|  | 4 | 0 | 0 | −0.1 | 0 | 0 |

PRESSURE DETECTION DEVICE AND PRESSURE DETECTION METHOD

CROSS-REFERENCE TO RELATED APPLICATIONS

This application is a continuation of U.S. patent application Ser. No. 12/393,530 filed on Feb. 26, 2009. This application claims the benefit of Japanese Patent Application No. 2008-48557 filed Feb. 28, 2008 and Japanese Patent Application No. 2009-11653 filed Jan. 22, 2009. The disclosures of the above applications are incorporated herein by reference.

BACKGROUND OF THE INVENTION

1. Field of the Invention

The present invention relates to a pressure detection technique.

2. Description of the Related Art

Some conventional pressure detection devices detect a pressing force based on variation of a resistance value of a pressure sensitive element in response to the pressing force (see, for example, JP07-253374A).

There are, however, restrictions on the shape of the pressure sensitive element, and it is sometimes difficult to make the pressure sensitive element to have a desired shape.

SUMMARY

An object of the present invention is to provide a pressure detection technology that is significantly different from the prior art technique.

According to an aspect of the present invention, a pressure detection device is provided. The pressure detection device comprises: a buffer member deformable by a pressure change, including one or more magnets; and a sensor assembly including one or more magnetic sensors to detect a variation of a magnetic field accompanied by deformation of the buffer member.

According to this configuration, the buffer member is deformable to vary the magnetic field in response to a pressure change applied to the buffer member. The magnetic sensor is used to detect such a variation of the magnetic field. The pressure detection device of this arrangement thus allows detection of a pressure change.

The present invention is not restricted to the pressure detection device having any of the various arrangements discussed above but may be actualized by diversity of other applications, for example, a pressure detection method, various apparatuses equipped with the pressure detection device, such as moving bodies, robots, and steering apparatuses, a control system utilizing the pressure detection device, and a recording medium in which the control system is recorded.

DESCRIPTION OF THE PREFERRED EMBODIMENT

Next, aspects of the present invention will be described in the following order on the basis of embodiments:

A. First Embodiment:
B. Second Embodiment
C. Third Embodiment
D. Fourth Embodiment
E. Fifth Embodiment
F. Sixth Embodiment
G. Seventh Embodiment
H. Eighth Embodiment
I. Ninth Embodiment
J. Modifications:

A. First Embodiment

Figure 1:
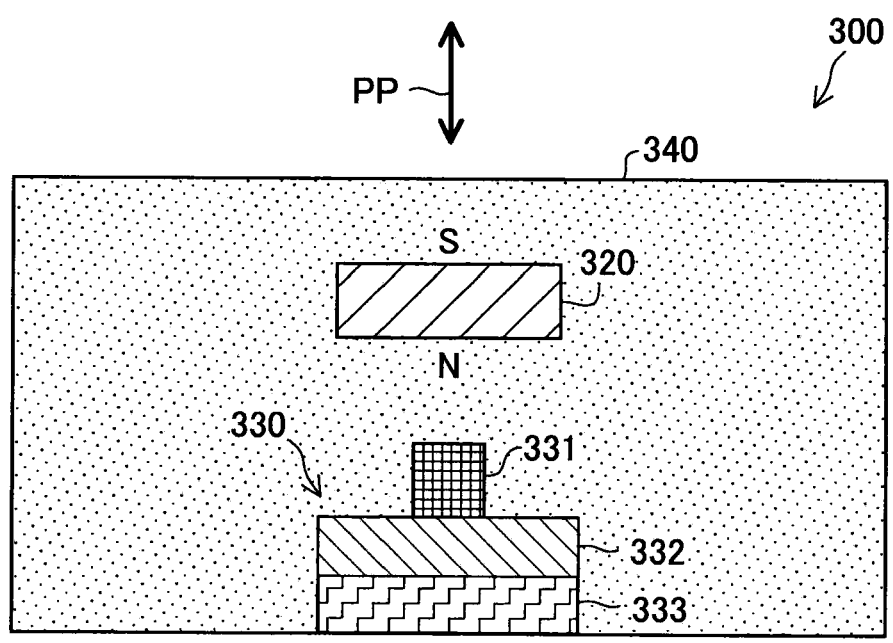
FIG. 1 is schematically illustrates the structure of a pressure detection device in a first embodiment of the invention.

FIG. 1 schematically illustrates the structure of a pressure detection device 300 in a first embodiment of the invention. The pressure detection device 300 includes a buffer member 340 with a permanent magnet 320 embedded therein, and a sensor assembly 330 provided below the permanent magnet 320. The buffer member 340 is arranged to surround the sensor assembly 330. The permanent magnet 320 is magnetized in a vertical direction in FIG. 1. The sensor assembly 330 has a magnetic sensor circuit 331, a circuit board 332, and a magnetic yoke 333. The magnetic sensor circuit 331 is fixed on the circuit board 332, and the magnetic yoke 333 is disposed on a rear face of the circuit board 332. The magnetic yoke 333 may be omitted when not required. The buffer member 340 is preferably made of a buffer material deformable to absorb an external shock or vibration, such as sponge or polyurethane foam. In the pressure detection device 300 of this structure, in response to deformation of the buffer member 340 by an external pressing force PP, the magnetic field varies at the location of the magnetic sensor circuit 331. The strength of the external pressing force PP is then detectable according to this variation of the magnetic field.

Figure 2:
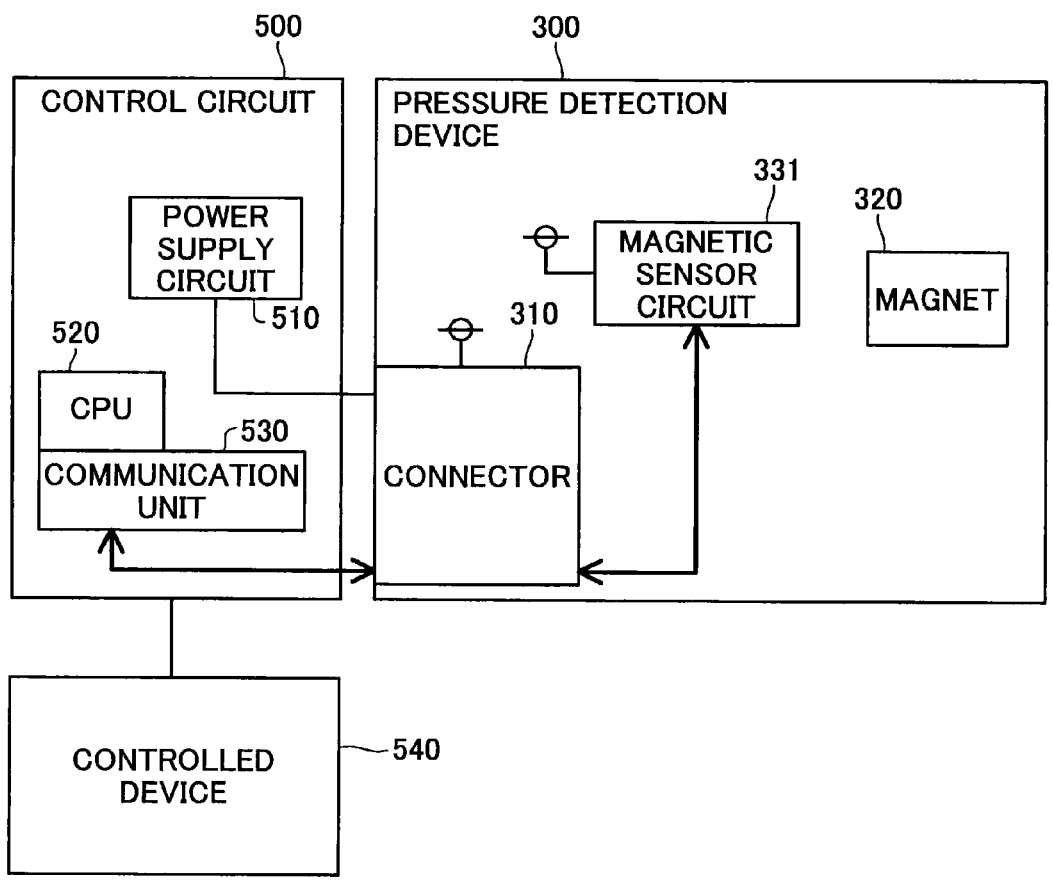
FIG. 2 is a block diagram showing the configuration of a control system utilizing the pressure detection device of the first embodiment.

FIG. 2 is a block diagram showing the configuration of a control system utilizing the pressure detection device 300 of the first embodiment. The control system of FIG. 2 includes the pressure detection device 300, a control circuit 500, and a controlled device 540. The control circuit 500 has a power supply circuit 510, a CPU 520, and a communication unit 530. The pressure detection device 300 has a connector 310, in addition to the magnetic sensor circuit 331 and the permanent magnet 320 discussed above with reference to FIG. 1. The connector 310 works as a connection terminal for electrically connecting the pressure detection device 300 to the control circuit 500. The control circuit 500 communicates with the pressure detection device 300, for example, by transmission of digital signals.

The control circuit 500 controls the operations of the controlled device 540, based on the detection result of the magnetic sensor circuit 331. The controlled device 540 may be any arbitrary device, for example, a motor or a heater. In a system having multiple magnetic sensor circuits 331 connected to the control circuit 500, the control circuit 500 identifies the respective multiple magnetic sensor circuits 331.

Figure 3:
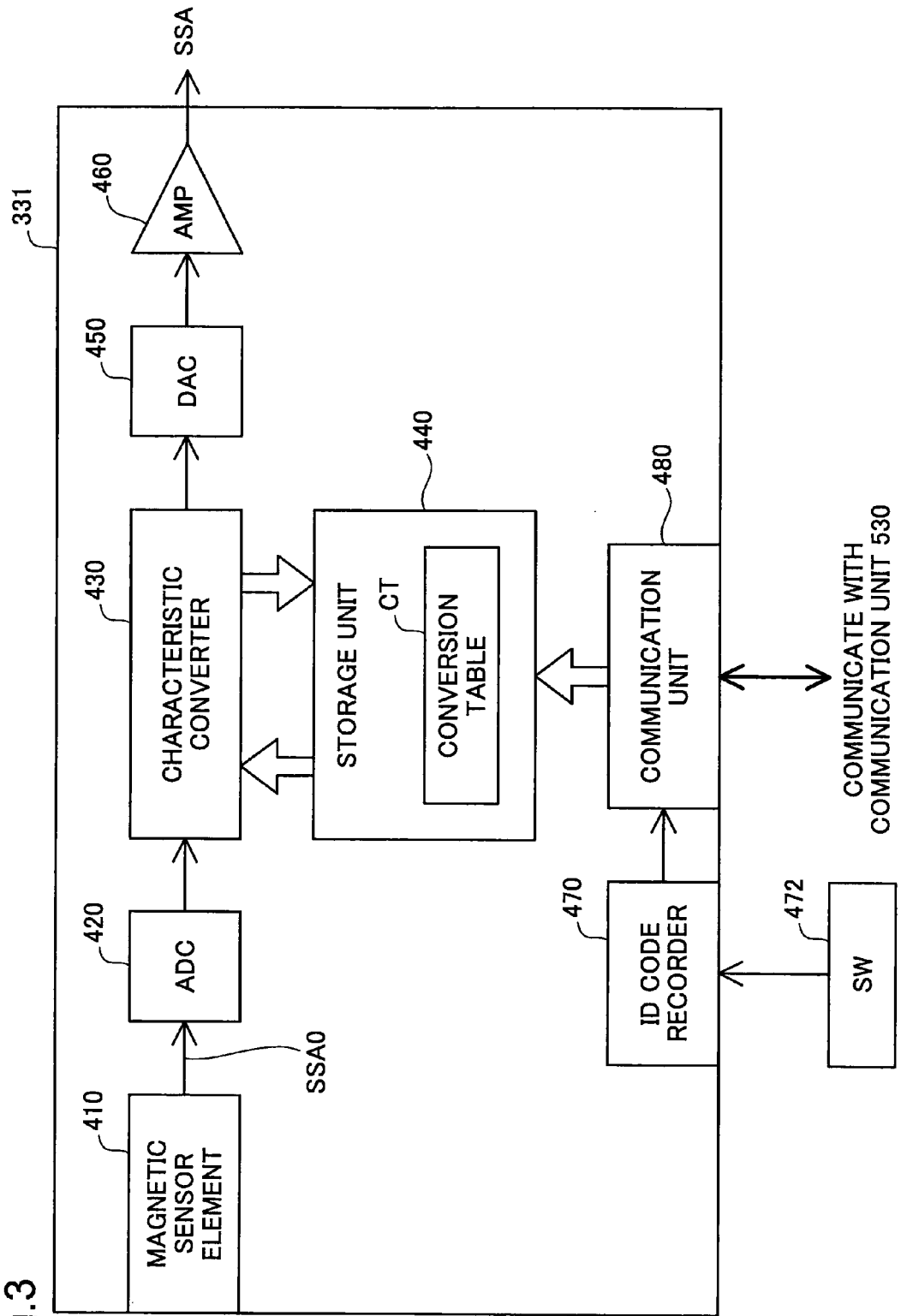
FIG. 3 is a block diagram showing the internal structure of the magnetic sensor circuit 331.

FIG. 3 is a block diagram showing the internal structure of the magnetic sensor circuit 331. The magnetic sensor circuit 331 includes a magnetic sensor element 410, an A-D converter 420, a characteristic converter 430, a storage unit 440, a D-A converter 450, an amplifier 460, an ID code recorder 470 functioning as the ID code storage unit, and a communication unit 480. The magnetic sensor element 410 is constructed, for example, by a Hall element.

The communication unit 480 of the magnetic sensor circuit 331 communicates with the communication unit 530 of the control circuit 500 and receives a sensor ID and correction data for a sensor output SSA0 from the control circuit 500. A sensor-specific ID uniquely allocated to the magnetic sensor circuit 331 is recorded in the ID code recorder 470. Alternatively, the ID may be set in the ID code recorder 470 by an external switch 472. In the structure of FIG. 3, the external switch 472, such as a dip switch, is used to set the ID in the ID code recorder 470. The ID may be recorded or set in the magnetic sensor circuit 331 by any other arbitrary means. One modified structure adopts a nonvolatile memory for the ID code recorder 470 with omission of the external switch 472. Upon matching of the ID supplied from the control circuit 500 with the ID recorded or set in the ID code recorder 470, the communication unit 480 stores the correction data supplied from the control circuit 500 into the storage unit 440. In the system having the multiple magnetic sensor circuits 331 connected to the control circuit 500, the correction data is transmittable to one specific magnetic sensor circuit 331 selected among the multiple magnetic sensor circuits 331 by taking advantage of such ID matching. The ID code recorder 470 and the external switch 472 may be omitted when not required. Any suitable structure other than the control circuit 500 may be adopted to send the correction data to the magnetic sensor circuit 331.

In the structure of FIG. 3, the correction data represents the contents of a conversion table CT, which is stored in the storage unit 440. The characteristic converter 430 utilizes this conversion table CT to correct the level of the sensor output SSA0 from the magnetic sensor element 410. This correction aims to adjust the input-output relation of the pressure detection device 300 to a desired shape, that is, desired input and output characteristics. In the configuration of this embodiment, the input of the pressure detection device 300 is the magnitude and the direction of the magnetic field varied by the external pressing force PP. The output of the pressure detection device 300 is a sensor output SSA of the magnetic sensor circuit 331. The sensor output corrected by the characteristic converter 430 is subject to digital-to-analog conversion in the D-A converter 450, is amplified by the amplifier 460, and is output as the sensor output SSA.

Any of the following tables may be adopted for the conversion table CT:

(1) a first lookup table having the level of the non-corrected sensor output SSA0 as its input and the level of the corrected sensor output SSA as its output;

(2) a second lookup table having the level of the non-corrected sensor output SSA0 as its input and the difference between the non-corrected sensor output SSA0 and the corrected sensor output SSA as its output; and (3) a third lookup table having the level of the non-corrected sensor output SSA0 as its input and the ratio of the corrected sensor output SSA to the non-corrected sensor output SSA0 as its output.

In application of the first lookup table, the characteristic converter 430 refers to the first lookup table to directly obtain the corrected sensor output SSA. In application of the second lookup table, the characteristic converter 430 adds the difference read out from the second lookup table to the output of the magnetic sensor element 410 to obtain the corrected sensor output SSA. In application of the third lookup table, the characteristic converter 430 multiplies the output of the magnetic sensor element 410 by the ratio read out from the third lookup table to obtain the corrected sensor output SSA.

Figure 4A:
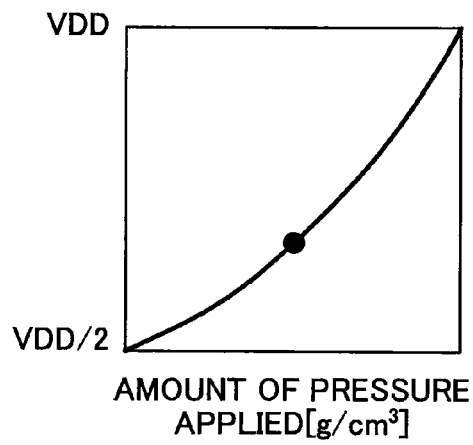
FIGS. 4A and 4B show an example of the desired input-output relation of the pressure detection device.
Figure 4B:
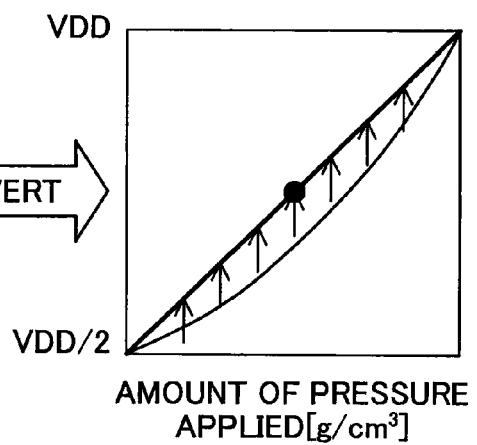

FIGS. 4A and 4B show an example of the desired input-output relation of the pressure detection device 300. FIG. 4A shows a non-converted (non-corrected) input-output relation, and FIG. 4B shows a converted (corrected) input-output relation. In these graphs of FIGS. 4A and 4B, the amount of pressure applied by the external pressing force PP is shown as abscissa and the sensor output SSA of the magnetic sensor circuit 331 as ordinate. In this example, the non-linear input-output relation of FIG. 4A is converted and corrected to the linear input-output relation of FIG. 4B. Such correction ensures a linear relation between the input (the amount of pressure applied) and the output (the sensor output SSA), independently of the installation condition of the pressure detection device 300. The control circuit 500 then readily performs adequate controls by utilizing this corrected sensor output SSA.

Figure 5A:
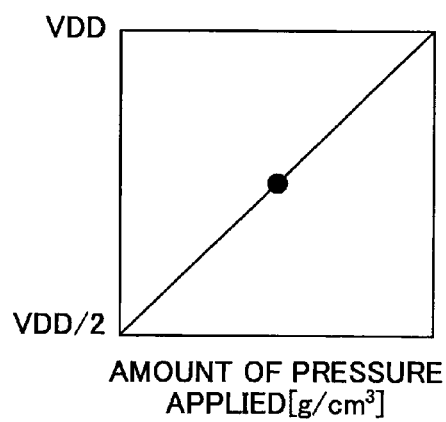
FIGS. 5A and 5B show another example of the desired input-output relation of the pressure detection device.
Figure 5B:
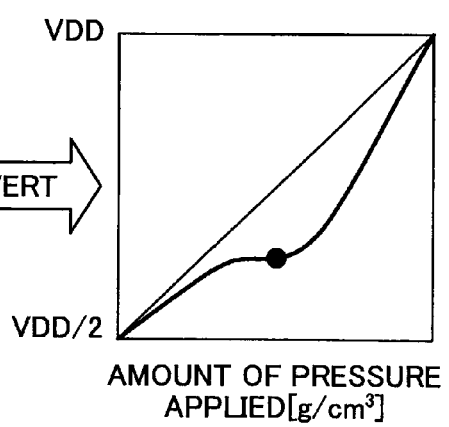

FIGS. 5A and 5B show another example of the desired input-output relation of the pressure detection device 300. In this example, a linear input-output relation of FIG. 5A is converted to a non-linear input-output relation of FIG. 5B. The converted input-output relation (input-output characteristic) may be any of various shapes including linear shapes and non-linear shapes.

Figure 6:
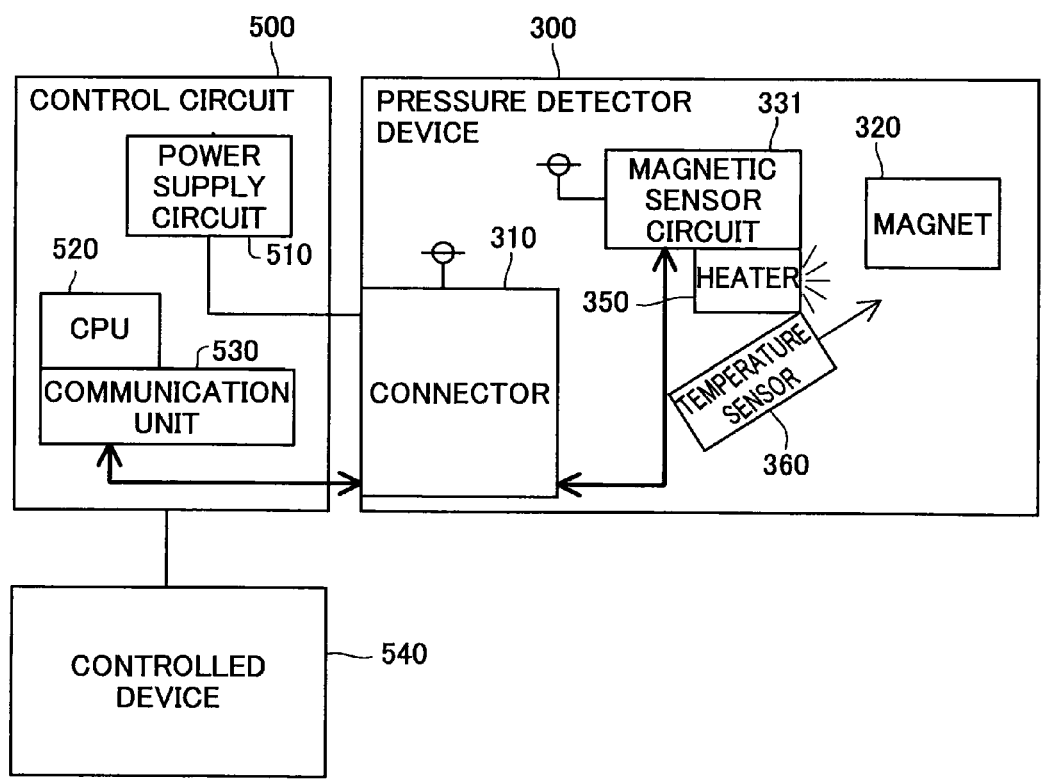
FIG. 6 is a block diagram showing the configuration of another control system utilizing the pressure detection device of the first embodiment.

FIG. 6 is a block diagram showing the configuration of another control system utilizing the pressure detection device 300 of the first embodiment. The control system of FIG. 6 includes a heater 350 and a temperature sensor 360, in addition to the configuration of the control system shown in FIG. 2. The temperature sensor 360 measures the temperature of the permanent magnet 320 in a non-contact manner. The temperature sensor 360 may alternatively be a conventional contact-type sensor. The heater 350 works to keep the permanent magnet 320 at a constant temperature and prevent a variation in hardness of the buffer material with a temperature variation. In a system having an insufficient space for the heater, a lookup table or another suitable means may be applied to correct the result of pressure detection based on the temperature detected by the temperature sensor and thereby eliminate the influence of a temperature variation on the hardness of the buffer material and the influence of the environmental temperature on the magnetic field. The control circuit 500 controls the output of the heater 350 to keep the temperature of the permanent magnet 320 at a desired temperature level. The control system of this configuration enables the temperature of the permanent magnet 320 to be kept substantially constant irrespective of the environmental temperature and thus desirably stabilizes the magnetic field generated by the permanent magnet 320. This arrangement ensures the precise detection of the external pressing force PP and the highly accurate control.

The pressure detection device of the first embodiment detects a pressure change in response to a variation of the magnetic field caused by deformation of the buffer member. Even in application of a thick buffer material for the buffer member, the pressure change is effectively detectable.

B. Second Embodiment

FIG. 7 schematically illustrates the structure of a pressure detection device 300a in a second embodiment of the invention. The primary difference from the pressure detection device 300 of the first embodiment shown in FIG. 1 is that a buffer member 340a includes multiple permanent magnets 320 in an evenly dispersed arrangement. Otherwise the structure of the pressure detection device 300a of the second embodiment is similar to the structure of the pressure detection device 300 of the first embodiment. The multiple permanent magnets 320a are preferably formed as tiny articles, such as powder articles, to be evenly dispersed in the buffer member 340a.

Figure 8A:
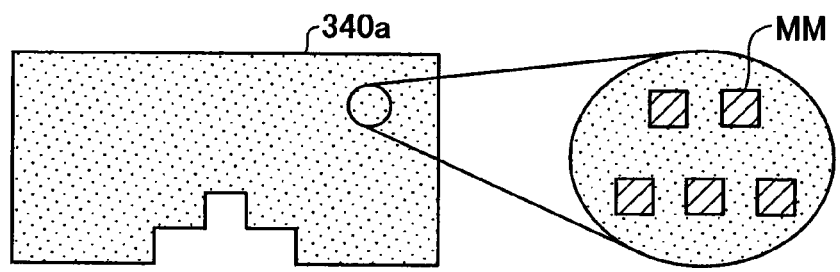
FIGS. 8A-8C show a manufacturing process of the pressure detection device of the second embodiment.
Figure 8B:
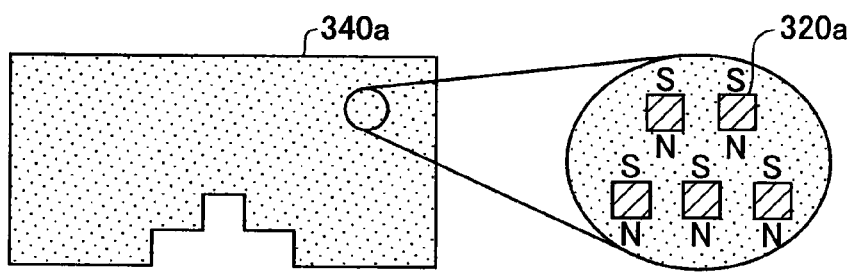
Figure 8C:
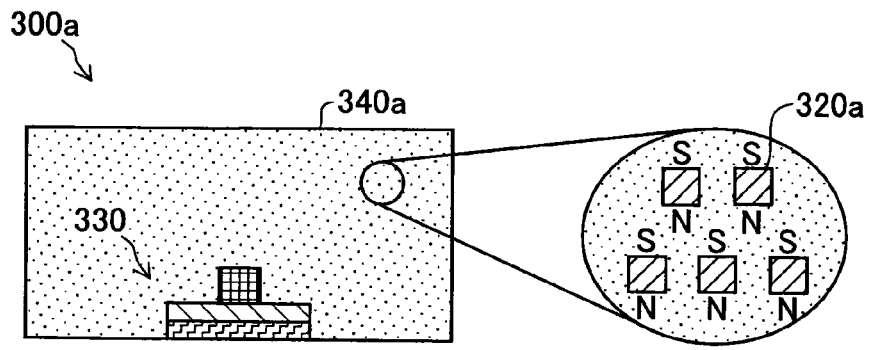

FIG. 8 shows a manufacturing process of the pressure detection device 300a of the second embodiment. At a first step, the buffer member 340a, which is deformable by a pressure change, is provided as shown in FIG. 8A. The buffer member 340 includes tiny non-magnetized magnet members MM. At a second step, the tiny non-magnetized magnet members MM are magnetized in a vertical direction in FIG. 8 to generate the permanent magnets 320a as shown in FIG. 8B. At a third step, the sensor assembly 330 is provided in the lower portion of the buffer member 340a as shown in FIG. 8C. This gives the pressure detection device 300a having the buffer member 340a with a large number of the tiny permanent magnets 320a in an evenly dispersed arrangement.

The pressure detection device of the second embodiment has the large number of tiny permanent magnets evenly dispersed in the buffer member. The pressure detection device of this structure detects a pressure change in response to a variation of the magnetic field caused by deformation of the buffer member, like the pressure detection device of the first embodiment. The multiple permanent magnets evenly dispersed in the buffer member allow effective detection of a pressure change at various sites in the buffer member.

C. Third Embodiment

Figure 7A:
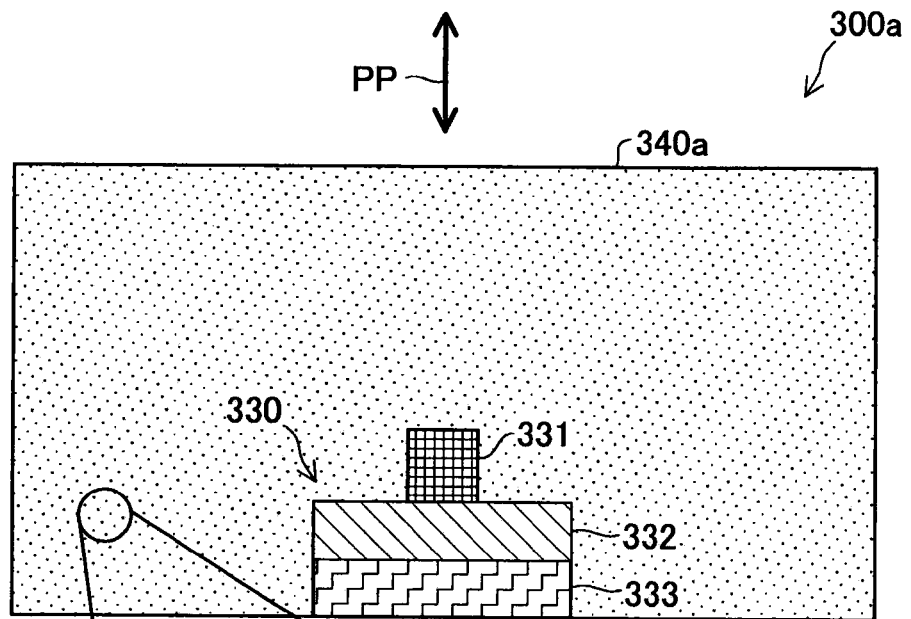
FIGS. 7A and 7B schematically illustrate the structure of a pressure detection device in a second embodiment of the invention.
Figure 7B:
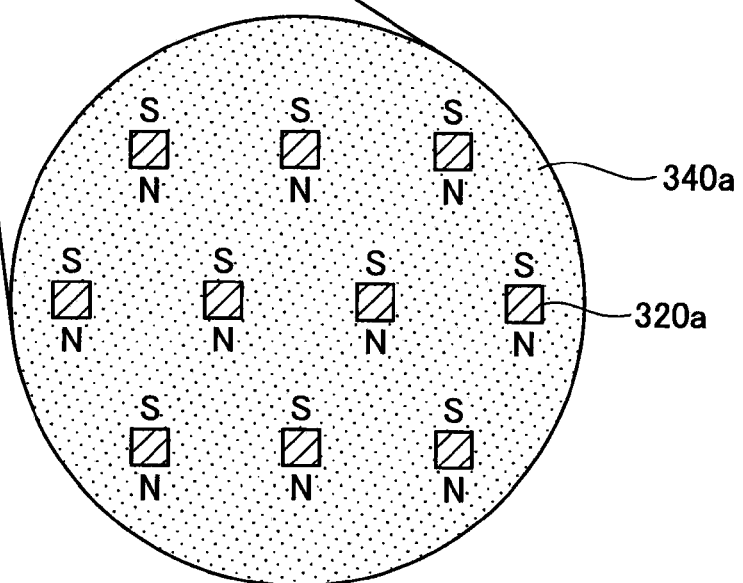
Figure 9A:
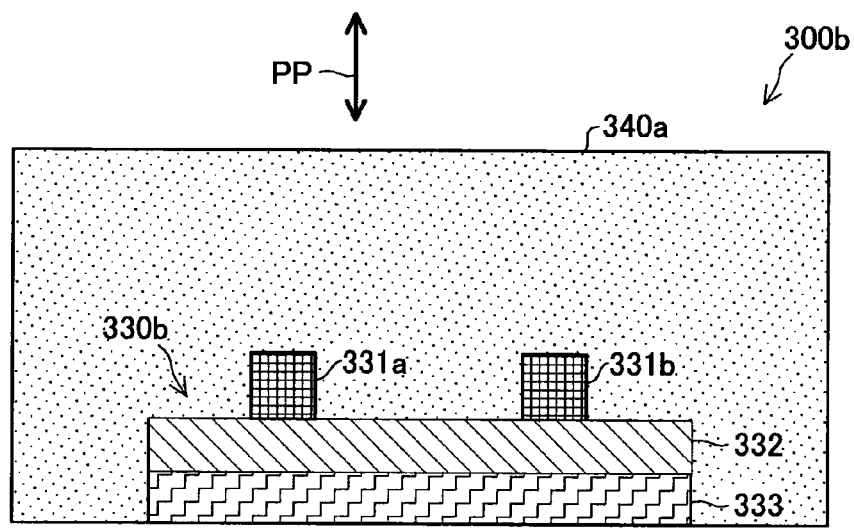
FIGS. 9A and 9B schematically illustrate the structure of a pressure detection device in a third embodiment of the invention.
Figure 9B:
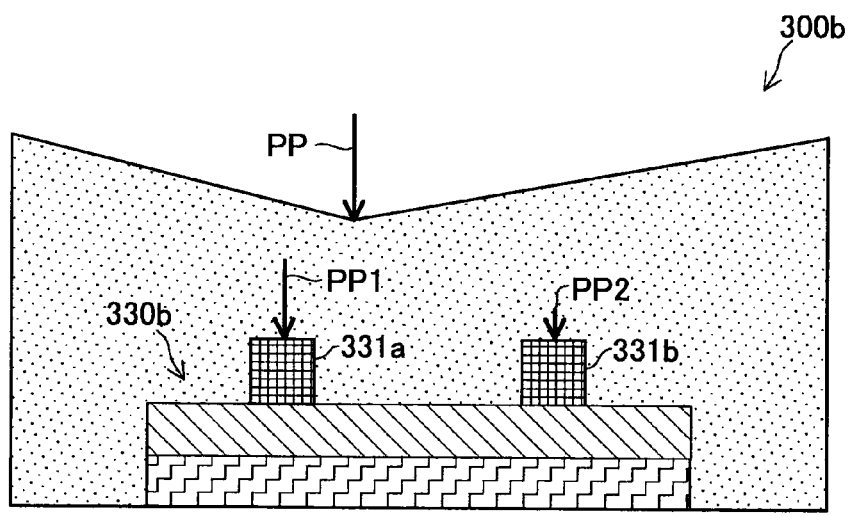

FIGS. 9A and 9B schematically illustrate the structure of a pressure detection device 300b in a third embodiment of the invention. The primary difference from the pressure detection device 300a of the second embodiment shown in FIGS. 7A and 7B is that a sensor assembly 330b includes multiple magnetic sensor circuits 331a and 331b arranged in a lateral direction in FIG. 9A. Otherwise the structure of the pressure detection device 300b of the third embodiment is similar to the structure of the pressure detection device 300a of the second embodiment. The structure of FIG. 9A has the two magnetic sensor circuits 331a and 331b, although the number of magnetic sensor circuits is not restricted to two but may be a greater number. FIG. 9B shows a distribution of pressure to the magnetic sensor circuit 331a and the magnetic sensor circuit 331b under application of an external pressing force PP to the pressure detection device 300b of the third embodiment. The position of application of the external pressing force PP is off from the center of the buffer member 340a to the side of the magnetic sensor circuit 331a. A pressure value PP1 detected by the magnetic sensor circuit 331a is accordingly greater than a pressure value PP2 detected by the magnetic sensor circuit 331b. The magnitude and the position of the external pressing force PP are detectable, based on the outputs of the multiple magnetic sensor circuits 331a and 331b.

The pressure detection device of the third embodiment has the multiple magnetic sensor circuits arranged in the lateral direction in the sensor assembly. The pressure detection device of this structure detects a pressure change in response to a variation of the magnetic field caused by deformation of the buffer member, like the pressure detection devices of the first and the second embodiments. In the structure of the third embodiment, the lateral arrangement of the multiple magnetic sensor circuits allows detection of a spatial pressure distribution in the lateral direction. A two-dimensional arrangement of multiple magnetic sensor circuits allows detection of a two-dimensional pressure distribution. Another arrangement of multiple magnetic sensor circuits along a curved surface will allow detection of a pressure distribution along the curved surface.

D. Fourth Embodiment

Figure 10:
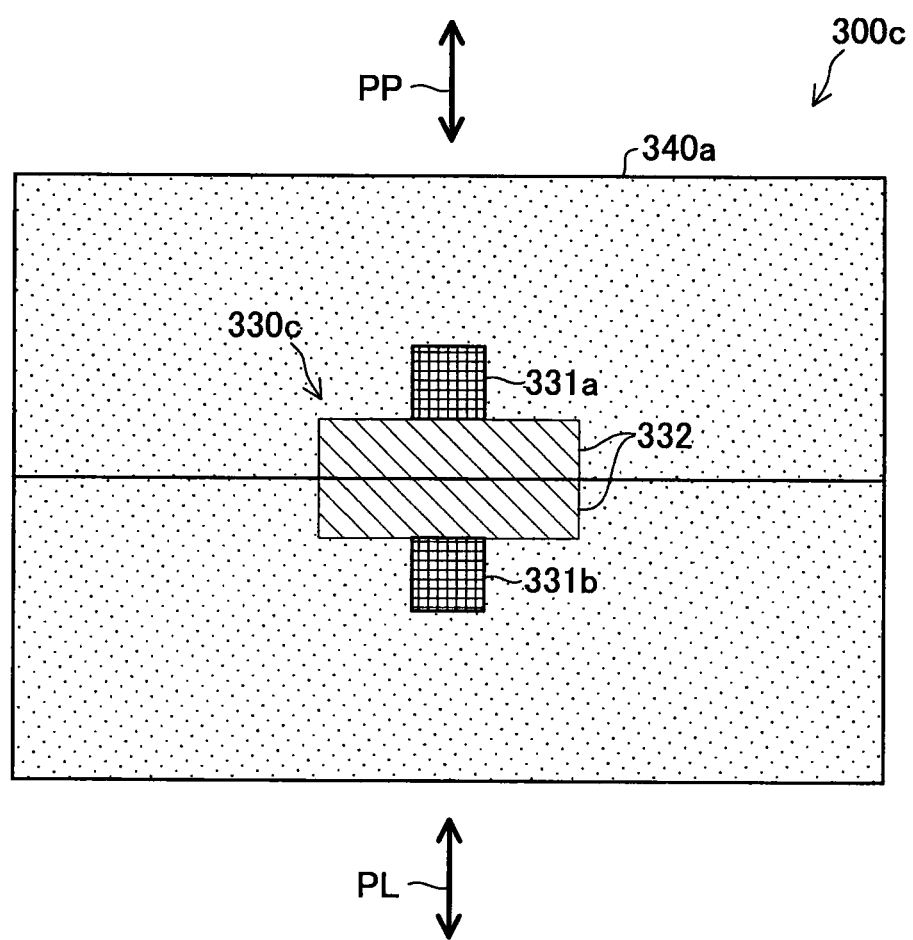
FIG. 10 schematically illustrates the structure of a pressure detection device in a fourth embodiment of the invention.

FIG. 10 schematically illustrates the structure of a pressure detection device 300c in a fourth embodiment of the invention. The primary difference from the pressure detection device 300b of the third embodiment shown in FIG. 9A is that a sensor assembly 330c includes multiple magnetic sensor circuits 331a and 331b arranged upward and downward in a vertical direction in FIG. 10. Otherwise the structure of the pressure detection device 300c of the fourth embodiment is similar to the structure of the pressure detection device 300b of the third embodiment. The vertical arrangement of the multiple magnetic sensor circuits 331a and 331b allows detection of external pressing forces PP and PL applied downward and upward onto the buffer member 340a. The magnetic yoke is omitted from the illustration of FIG. 10.

The pressure detection device of the fourth embodiment has the multiple magnetic sensor circuits arranged in the vertical direction in the sensor assembly. The pressure detection device of this structure detects a pressure change in response to a variation of the magnetic field caused by deformation of the buffer member, like the pressure detection devices of the first through the third embodiments. In the structure of the fourth embodiment, the vertical arrangement of the multiple magnetic sensor circuits allows detection of a spatial pressure distribution in the vertical direction.

E. Fifth Embodiment

Figure 11:
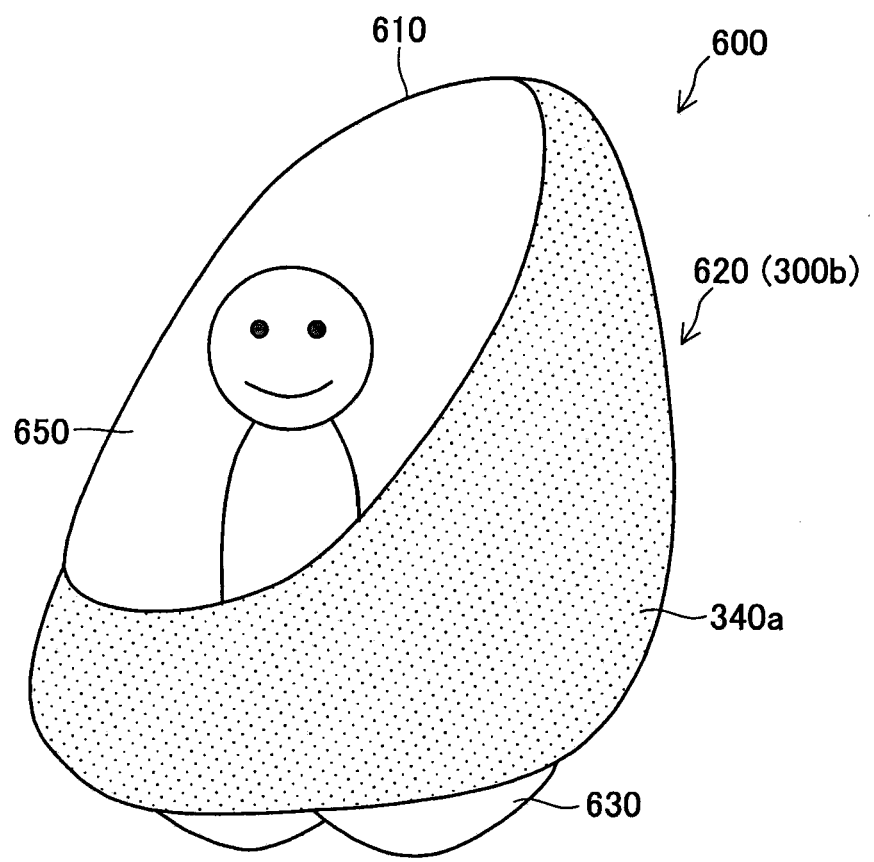
FIG. 11 schematically shows the configuration of a vehicle equipped with a pressure detection device in a fifth embodiment of the invention.

FIG. 11 schematically shows the configuration of a vehicle 600 equipped with a pressure detection device in a fifth embodiment of the invention. The vehicle 600 includes a windshield 610, a pressure detector 620, wheels 630, and a compartment 650. The pressure detection device 300b of the third embodiment shown in FIGS. 9A and 9B, for example, is applied for the pressure detector 620. In the vehicle 600 of this embodiment, the pressure detection device 300b is arranged to cover part of the body of the vehicle 600 with the buffer member 340a (see FIG. 9A). In one preferable application, a large number of magnetic sensor circuits are substantially evenly arranged within the buffer member 340a. The pressure detector 620 is, however, not restricted to this pressure detection device 300b but may be any of the other pressure detection devices of the embodiments discussed above.

Figure 12:
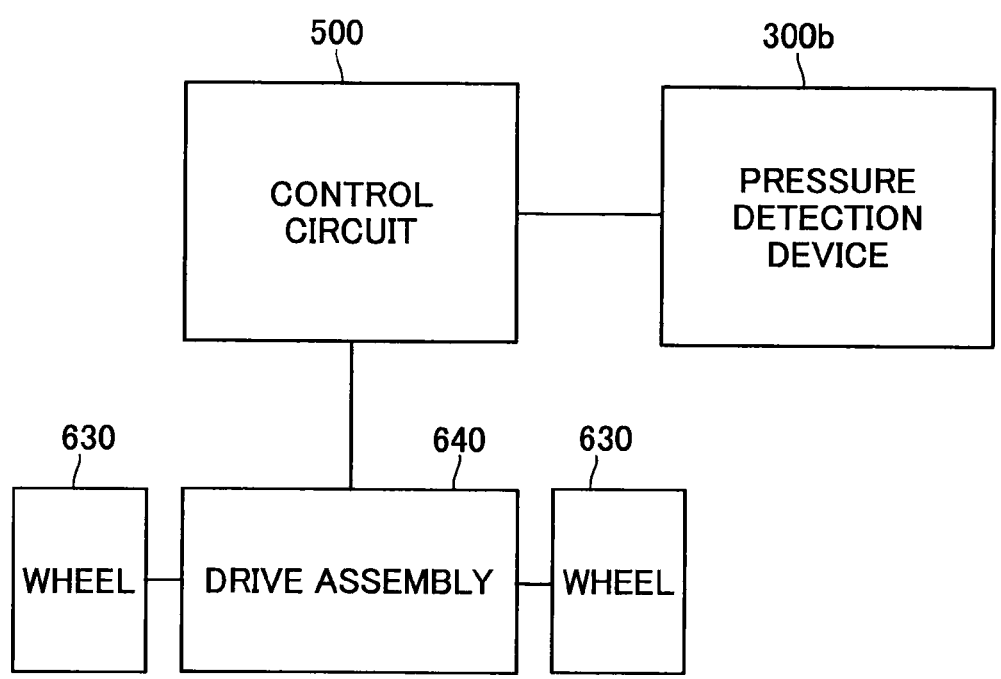
FIG. 12 is a block diagram showing a control system of the vehicle equipped with the pressure detection device in the fifth embodiment.

FIG. 12 is a block diagram showing a control system of the vehicle 600 equipped with the pressure detection device 300b in the fifth embodiment. The control system includes the pressure detection device 300b, a control circuit 500, a drive assembly 640, and wheels 630. The internal structure of the pressure detection device 300b and the control circuit 500 is substantially identical with the internal structure of FIG. 2 and is thus not specifically described here. The control circuit 500 uses the information supplied from the pressure detection device 300b to control the operations of the drive assembly 640. The drive assembly 640 preferably includes a drive control circuit (not shown) of controlling an actuator (for example, an electric motor) to drive the wheels 630.

Figure 13:
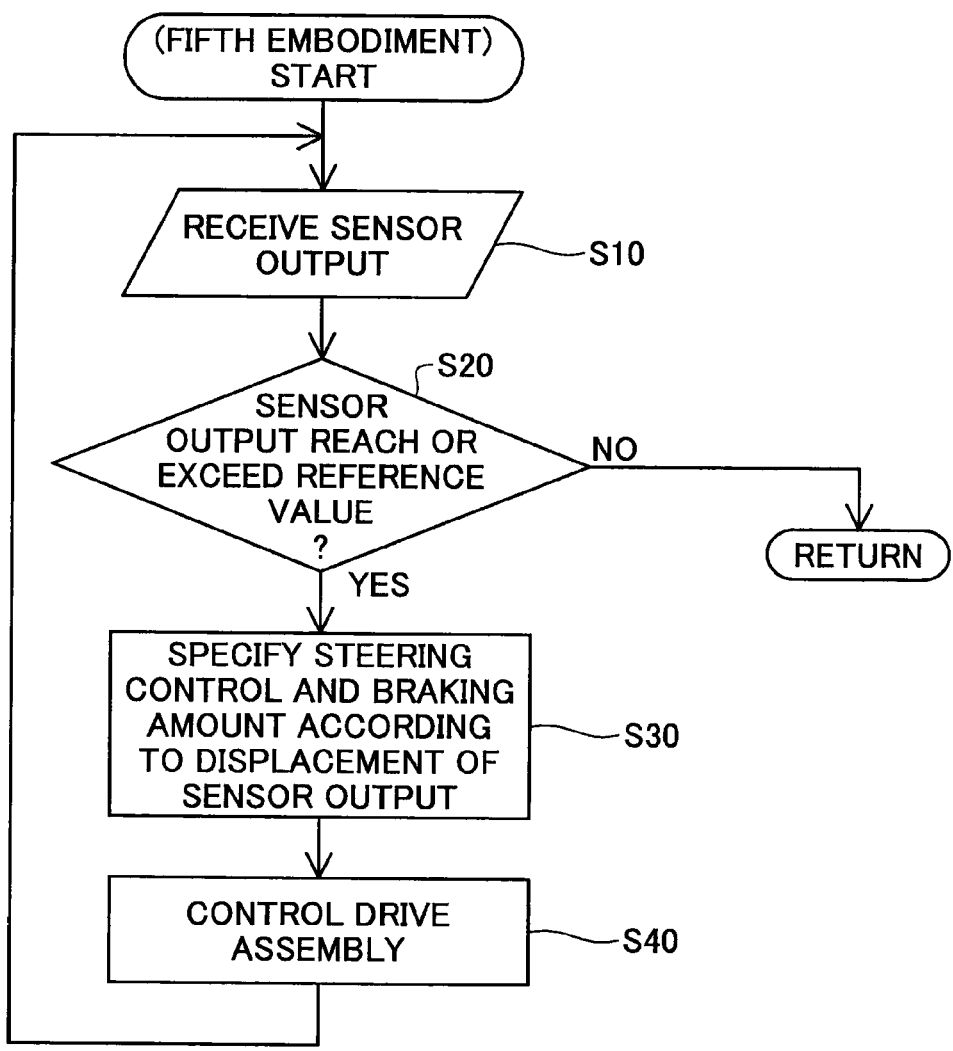
FIG. 13 is a flowchart showing a control process of the drive assembly 640 by the control circuit.

FIG. 13 is a flowchart showing a control process of the drive assembly 640 by the control circuit 500. At step S10, the communication unit 530 of the control circuit 500 establishes communication with the communication unit 480 of the magnetic sensor circuit 331 to receive the sensor output SSA. At step S20, it is determined whether the received sensor output SSA reaches or exceeds a preset reference value. Upon determination that the received sensor output SSA is not less than the preset reference value, the control circuit 500 specifies the steering control and the braking amount according to the deformation indicated by the sensor output SSA at step S30. For example, the control circuit 500 steers the vehicle 600 in an opposite direction to the direction of the detected pressure. In another example, the control circuit 500 stops the vehicle 600 in response to detection of a certain pressure. At step S40, the control circuit 500 controls the operations of the drive assembly 640 according to the specification of step S30.

The vehicle equipped with any of the pressure detection devices of the first through the fourth embodiments detects a shock applied to the vehicle and performs the steering control and the braking control based on the detection.

F. Sixth Embodiment

Figure 14:
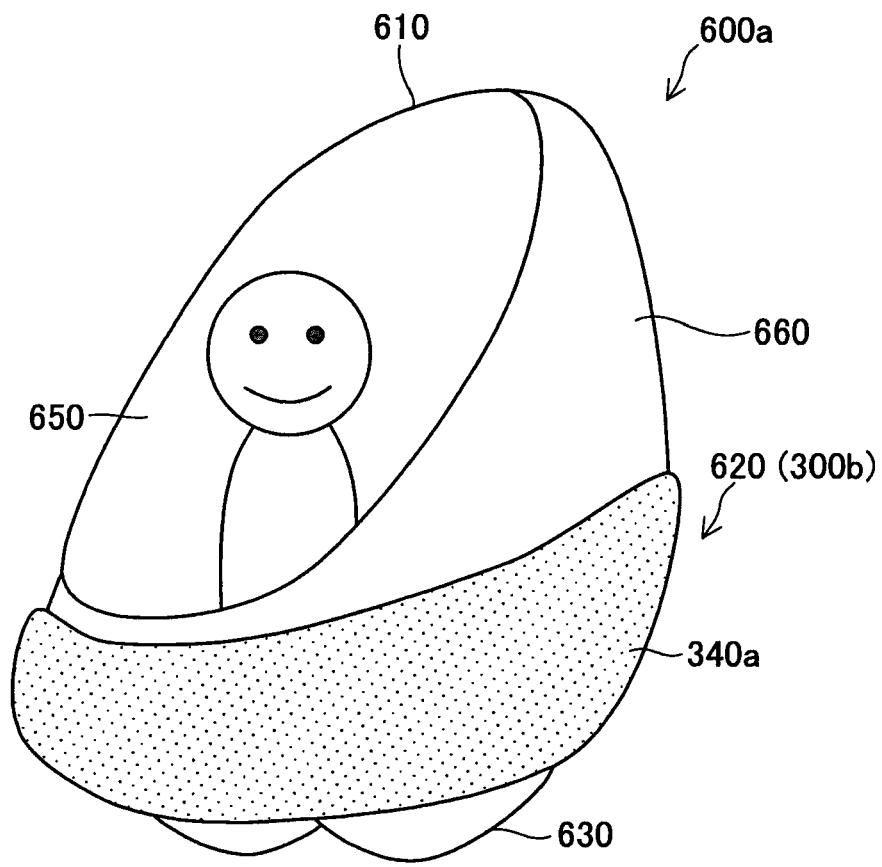
FIG. 14 schematically shows the structure of a vehicle equipped with a pressure detection device in a sixth embodiment of the invention.

FIG. 14 schematically shows the structure of a vehicle 600a equipped with a pressure detection device in a sixth embodiment of the invention. The difference from the vehicle 600 of the fifth embodiment shown in FIG. 11 is only the location of the pressure detector 620 that covers only part of a lower portion of the body of the vehicle 600a. Otherwise the configuration of the vehicle 600a of the sixth embodiment is similar to the configuration of the vehicle 600 of the fifth embodiment. It is generally preferable to locate the pressure detector 620 at a specific portion that is expected to receive a shock applied to the vehicle.

The configuration of the sixth embodiment has the pressure detection device located at only the specific portion especially requiring detection of a shock, thus desirably reducing the manufacturing cost of the vehicle.

G. Seventh Embodiment

Figure 15:
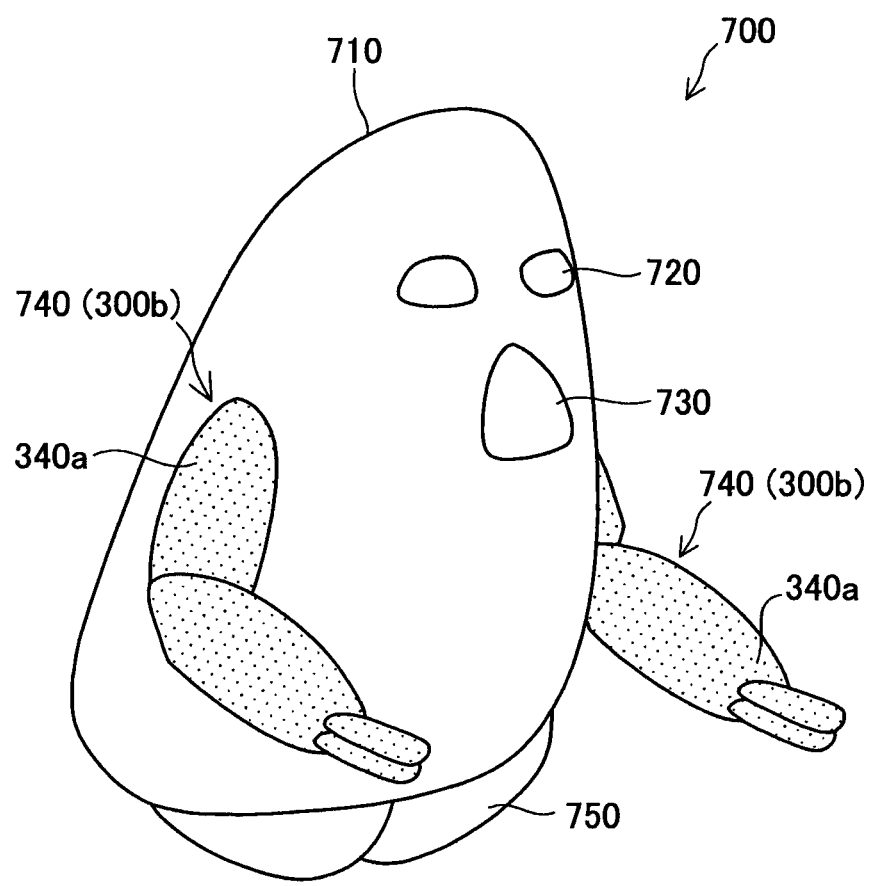
FIG. 15 schematically illustrates the configuration of a robot equipped with a pressure detection device in a seventh embodiment of the invention.

FIG. 15 schematically illustrates the configuration of a robot 700 equipped with a pressure detection device in a seventh embodiment of the invention. The robot 700 includes a body 710, a visual sensing unit 720, a voice unit 730, a haptic unit 740, and a moving mechanism 750. The pressure detection device 300b of the third embodiment discussed above is applied for the haptic unit 740. The surface of the haptic unit 740 is covered with the buffer member 340a. For example, in response to detection of some pressing force applied to the haptic unit 740, a control circuit (not shown) may control a drive assembly (not shown) to operate the robot 700. In response to detection of a specific pressure applied to the haptic unit 740, the control circuit may assume that the robot 700 grips some object and control the operations of the robot 700. The visual sensing unit 720, the voice unit 730, and the moving mechanism 750 may be omitted when not required.

H. Eighth Embodiment

Figure 16:
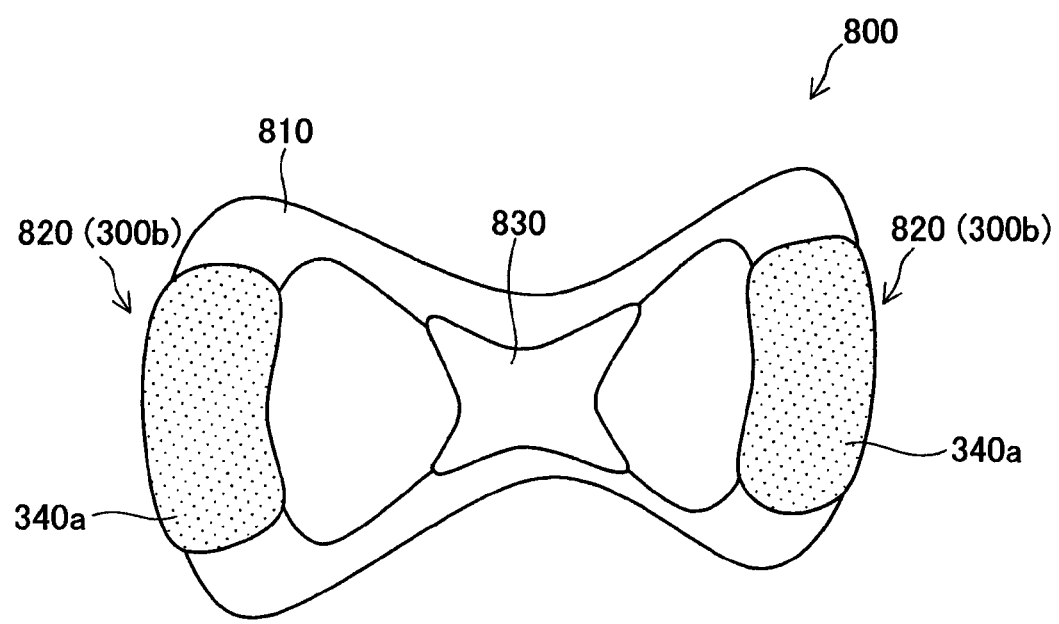
FIG. 16 schematically illustrates the structure of a steering apparatus equipped with a pressure detection device in an eighth embodiment of the invention.

FIG. 16 schematically illustrates the structure of a steering apparatus 800 equipped with a pressure detection device in an eighth embodiment of the invention. The steering apparatus 800 includes a steering command unit 810, a grip 820, and an operation panel 830. The steering apparatus 800 may be attached to a vehicle (not shown). The pressure detection device 300b of the third embodiment discussed above is applied for the grip 820. The surface of the grip 820 is covered with the buffer member 340a. For example, in response to no detection of the driver's gripping pressure applied to the grip 820 because of the driver's drowsy driving, a control circuit (not shown) may controls a drive assembly (not shown) of the vehicle to forcibly brake the vehicle. The operation panel 830 may be omitted when not required.

I. Ninth Embodiment

Figure 17:
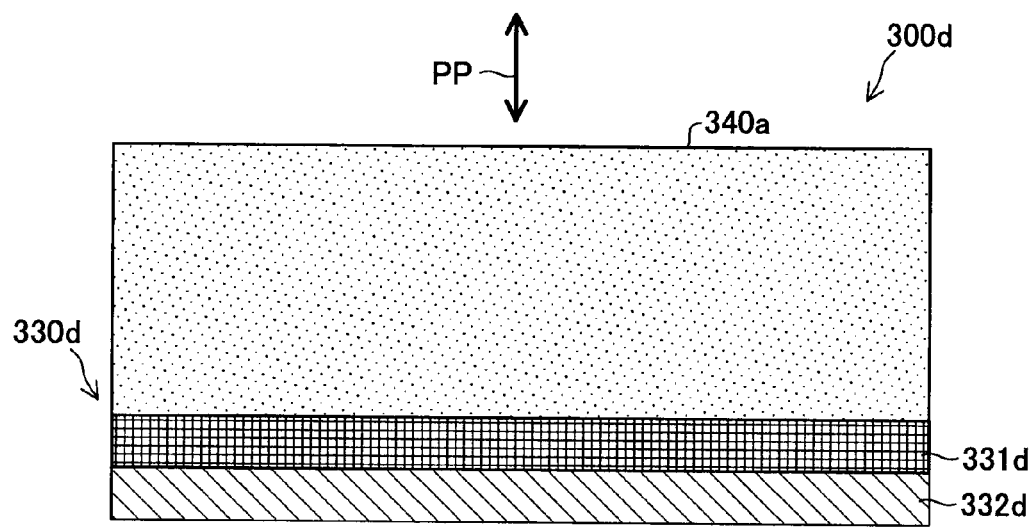
FIG. 17 schematically illustrates the structure of a pressure detection device in a ninth embodiment of the invention.

FIG. 17 schematically illustrates the structure of a pressure detection device 300d in a ninth embodiment of the invention. The primary difference from the pressure detection device 300a of the second embodiment shown in FIGS. 7A and 7B is the structure of a sensor assembly 330d. Otherwise the structure of the pressure detection device 300d of the ninth embodiment is similar to the structure of the pressure detection device 300a of the second embodiment. In the sensor assembly 330d of the ninth embodiment, a magnetic sensor circuit layer 331d and a circuit board layer 332d are laid one upon the other and are spread over the whole lower face of the buffer member 340a. The circuit board layer 332d is made of a flexible material that is highly flexible and is substantially deformable. The magnetic yoke is omitted from the illustration of FIG. 17.

Figure 18:
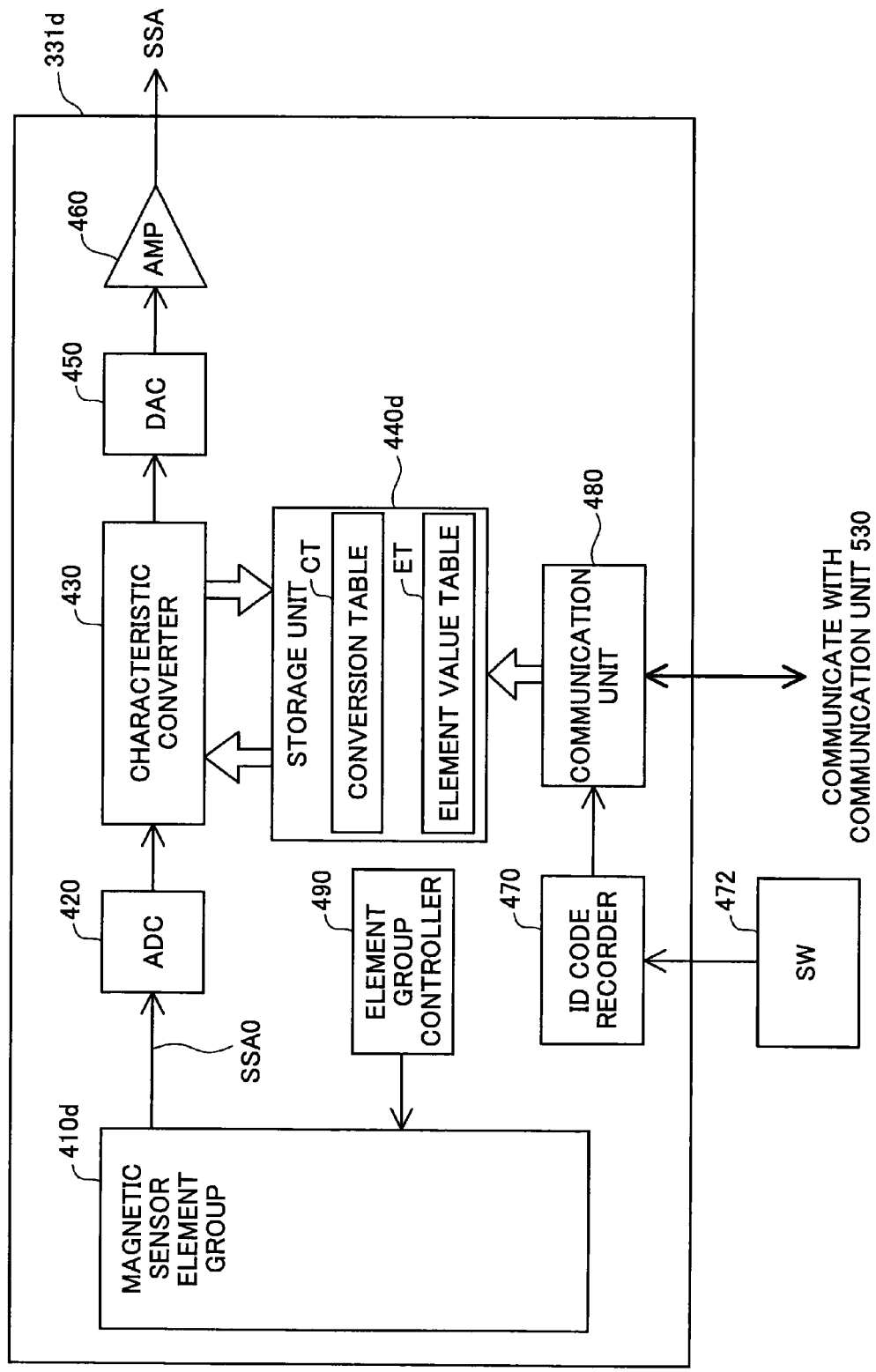
FIG. 18 is a block diagram showing the internal structure of the magnetic sensor circuit.

FIG. 18 is a block diagram showing the internal structure of the magnetic sensor circuit 331d. The primary difference from the magnetic sensor circuit 331 of the second embodiment (see FIG. 3) is the presence of a magnetic sensor element group 410d instead of the single magnetic sensor element 410, an element group controller 490, and an element value table ET. The other structure and the operations of the magnetic sensor circuit 331d of the ninth embodiment are similar to those of the magnetic sensor circuit 331 of the second embodiment. The magnetic sensor element group 410d includes multiple magnetic sensor elements, for example, multiple Hall elements. The element group controller 490 functions to control the magnetic sensor element group 410d as discussed below. The element value table ET is provided in a storage unit 440d to store sensor outputs from the magnetic sensor element group 410d. There may be multiple magnetic sensor circuits 331d in the pressure detection device 300d of the ninth embodiment. Upon matching of an ID supplied from an external device (for example, the control circuit 500 shown in FIG. 2) with an ID recorded or set in the ID code recorder 470 in one of the multiple magnetic sensor circuits 331d, the external device is allowed to update the contents of the conversion table CT stored in the magnetic sensor circuit 331d with the matching ID. The external device (for example, the control circuit 500) is also allowed to read out data from the element value table ET via the communication unit 480.

Figure 19:
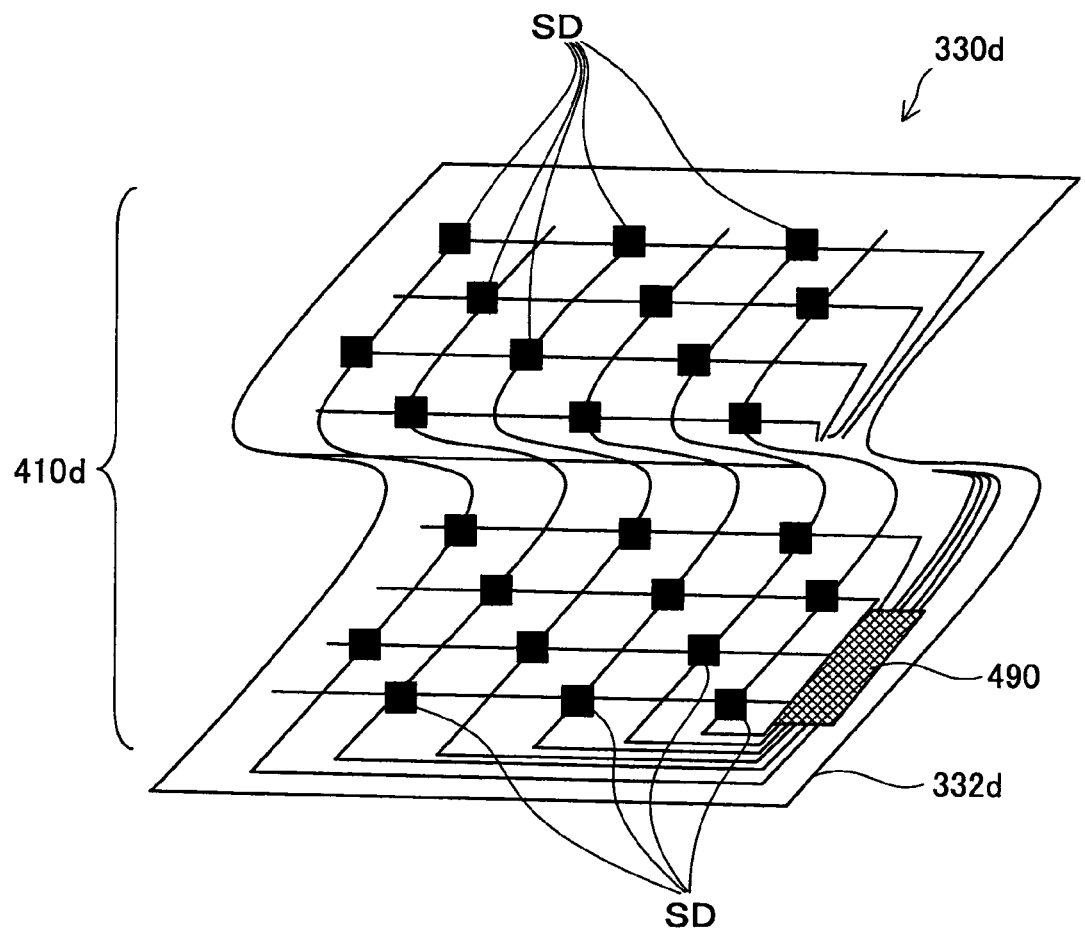
FIG. 19 shows the schematic structure of the sensor assembly.

FIG. 19 shows the schematic structure of the sensor assembly 330d. Multiple magnetic sensor elements SD are evenly arranged on the flexible circuit board 332d. The magnetic sensor elements SD are located at vertex positions of identical triangles, which are not actually but virtually arranged in a tile-like arrangement. These multiple magnetic sensor elements SD are collectively referred to as the 'magnetic sensor element group 410d'. The triangles defining the locations of the respective magnetic sensor elements SD may be, for example, isosceles triangles or equilateral triangles. The magnetic sensor elements SD are connected to the element group controller 490 by means of independently communicable buses. The constituents of the magnetic sensor circuit 331d other than the magnetic sensor element group 410d and the element group controller 490 are omitted from the illustration of FIG. 19.

Figure 20:
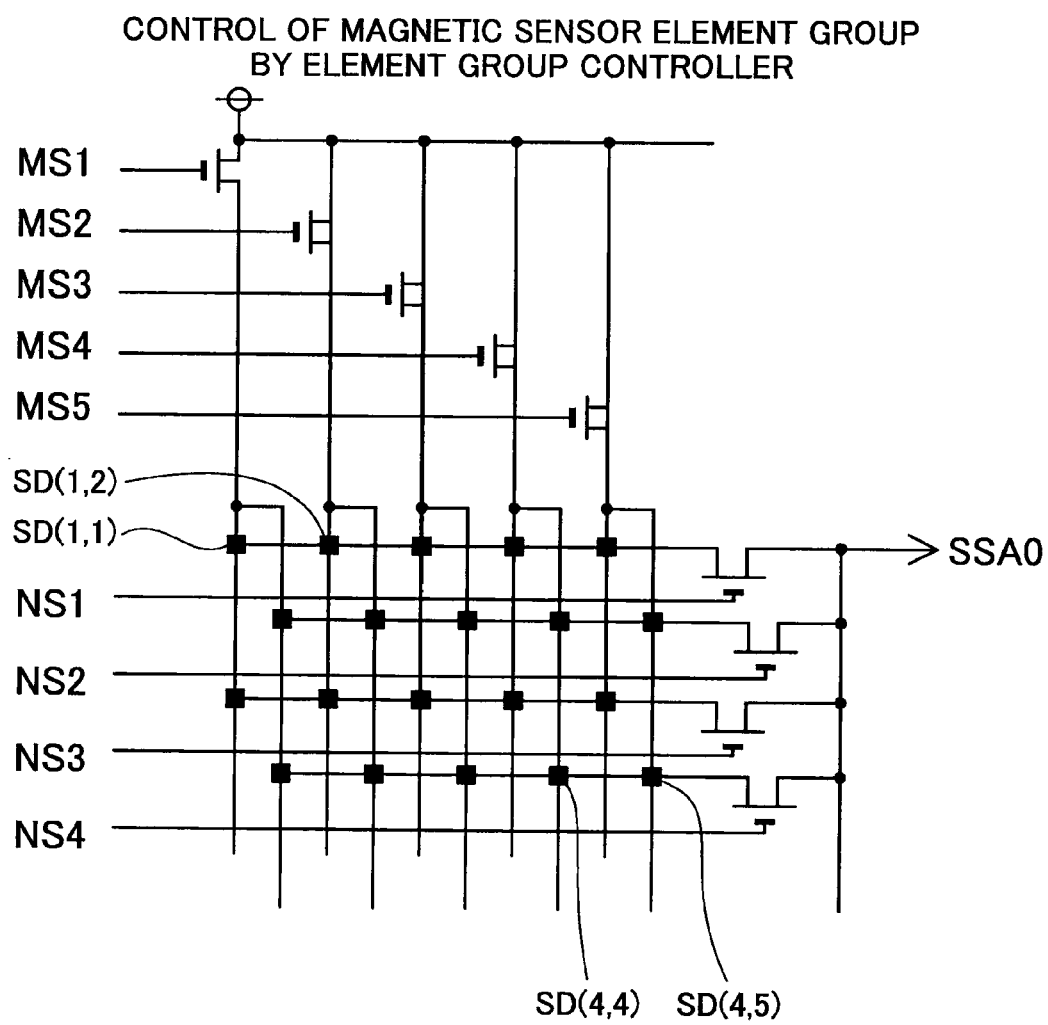
FIG. 20 shows control of the magnetic sensor element group by the element group controller.

FIG. 20 shows control of the magnetic sensor element group 410d by the element group controller 490. On the assumption of the magnetic sensor elements SD as a matrix, a certain magnetic sensor element SD is specifiable as SD(i,j). For example, setting a switch NS1 ON (with switches NS2 to NS4 set OFF) and subsequently setting a switch MS1 ON (with switches MS2 to MS5 OFF) gives a sensor output SSA0 from a certain magnetic sensor element SD(1,1). In this manner, the element group controller 490 successively obtains sensor outputs SSA0 from magnetic sensor elements SD(1,1) to SD(4,5). The respective sensor outputs SSA0 are transmitted together with identification information for identifying the respective magnetic sensor elements SD to the A-D converter 420 and are corrected according to the procedure discussed previously with reference to FIG. 3. The corrected sensor outputs SSA are stored in the element value table ET.

Figures 21, 22:
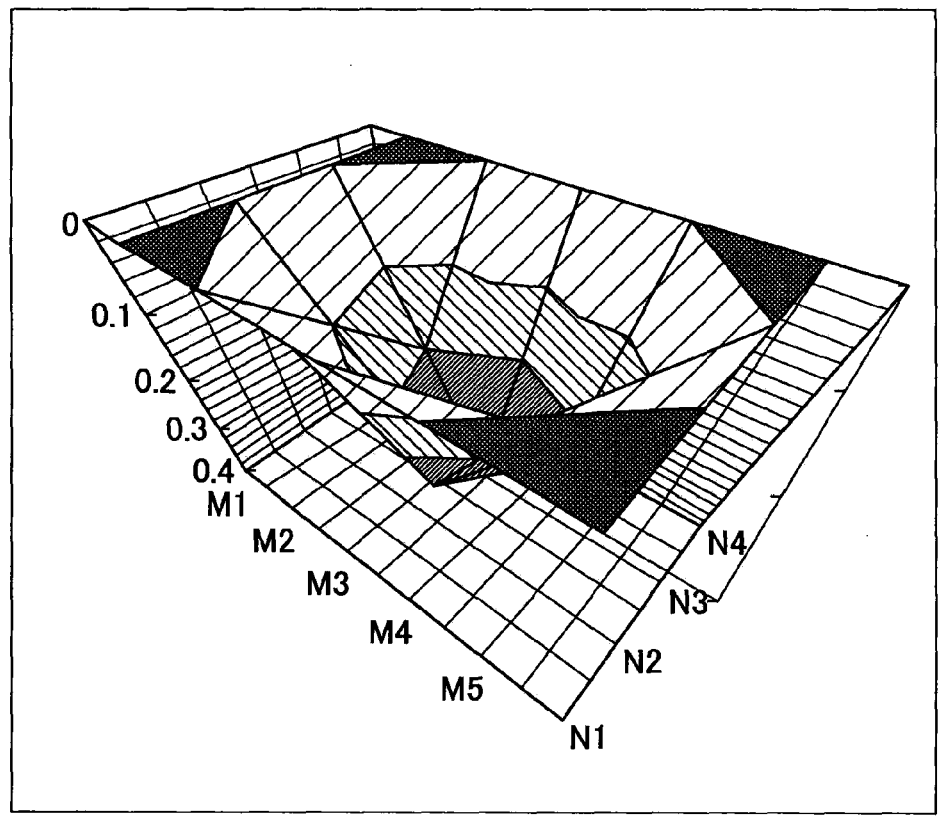
FIG. 21 is a table showing one example of the sensor output SSA at a certain time.
FIG. 22 visualizes the table of FIG. 21.

FIG. 21 is a table showing one example of the sensor output SSA at a certain time. FIG. 22 visualizes the table of FIG. 21. As shown in FIGS. 21 and 22, the magnitude of pressure application is detectable at each point where the magnetic sensor element SD is located. A maximum pressure point among the respective points of the magnetic sensor elements SD is computable from the sensor outputs SSA.

The pressure detection device of the ninth embodiment detects a pressure change in response to a variation of the magnetic field caused by deformation of the buffer member, like the pressure detection devices of the first and the second embodiments. In the pressure detection device of the ninth embodiment, the magnetic sensor circuit layer is provided above the flexible circuit board layer. This arrangement allows detection of a pressure change in objects of various shapes. The dense arrangement of the evenly-distributed multiple magnetic sensor elements gives a highly accurate pressure distribution as shown in FIG. 22.

J. Modifications

The embodiments and their applications discussed above are to be considered in all aspects as illustrative and not restrictive. There may be many modifications, changes, and alterations without departing from the scope or spirit of the main characteristics of the present invention. Some examples of possible modification are given below.

J1. Modified Example 1

In the pressure detection devices of the respective embodiments discussed above, the magnet included in the buffer member is a permanent magnet. This is, however, neither essential nor restrictive, and the magnet may be an electromagnet.

J2. Modified Example 2

In the pressure detection devices of the respective embodiments discussed above, the permanent magnet is magnetized in the vertical direction in the drawings. The magnetizing direction may be a lateral direction or any suitable direction other than the vertical direction and the lateral direction.

J3. Modified Example 3

In the embodiments discussed above, the pressure detection device communicates with the control circuit by transmission of digital signals. This is, however, neither essential nor restrictive. The communication may be made by transmission of analog signals, by optical communication, or via a power line.

J4. Modified Example 4

In the pressure detection devices of the respective embodiments discussed above, the characteristic converter corrects the sensor output SSA0 of the magnetic sensor element. A function operator using a specified function may be used, instead of the characteristic converter, to perform the correction. The correction may be omitted when not required.

J5. Modified Example 5

The pressure detection device of the invention is applicable to various apparatuses and equipment to detect a pressure. In the fifth and the sixth embodiments, the pressure detection device given as the pressure detector is provided as part of the vehicle body. The location of the pressure detection device is, however, not restricted to the vehicle body but may be determined according to the requirements. For example, the pressure detection device may be provided as part of a bumper, part of a door, or as part of a compartment interior. In the seventh embodiment, the pressure detection device given as the haptic unit is provided on the arms of the robot. The location of the pressure detection device is, however, not restricted to the arms of the robot but may be the body of the robot or the legs of the robot. In the eighth embodiment, the pressure detection device is given as the grip of the steering apparatus. The pressure detection device is, however, not restricted to the grip of the steering apparatus but may be the steering command unit or the operation panel of the steering apparatus.

J6. Modified Example 6

In the pressure detection device of the ninth embodiment, the magnetic sensor elements SD are located at the vertex positions of the identical triangles in the tile-like arrangement. The magnetic sensor elements SD may have any desired arrangement unless such modification does not depart from the scope or spirit of the main characteristics of the present invention. For example, the magnetic sensor elements SD may be evenly arranged at vertex positions of identical squares or identical hexagons in a tile-like arrangement. Any of such evenly-dispersed arrangements of multiple magnetic sensor elements gives a highly accurate pressure distribution detection.

What is claimed is:

1. A pressure detection device, comprising:
   a buffer member that is deformable by a pressure change, the buffer member including a plurality of magnets which are spaced apart from one another; and
   a sensor assembly including at least one magnetic sensor to detect a variation of a magnetic field accompanied by deformation of the buffer member.

2. The pressure detection device according to claim 1, wherein the sensor assembly includes a plurality of the magnetic sensors.

3. The pressure detection device according to claim 1, wherein the at least one magnetic sensor is provided on a flexible circuit board.

4. The pressure detection device according to claim 3, wherein the at least one magnetic sensor includes a plurality of magnetic sensor elements, and
   the plurality of magnetic sensor elements are evenly arranged on the flexible circuit board.

5. The pressure detection device according to claim 3, wherein the at least one magnetic sensor includes a plurality of magnetic sensor elements, and
   the plurality of magnetic sensor elements are located at vertex positions of identical virtual triangles which are virtually arranged in a tile-like arrangement on the flexible circuit board.

6. The pressure detection device according to claim 1, wherein the at least one magnetic sensor includes:
   a communication module that communicates with an external device; and
   an ID code storage module that stores an identification code allocated for identifying each magnetic sensor, and
   the external device is accessible to any magnetic sensor among the magnetic sensors by referring to the identification code stored in the ID code storage module.

7. A moving body, comprising:
   the pressure detection device according to claim 1; and
   a controller that controls the moving body, based on a detection result of the pressure detection device.

8. A robot, comprising:
   the pressure detection device according to claim 1; and
   a controller that controls the robot, based on a detection result of the pressure detection device.

9. A steering apparatus, comprising:
   the pressure detection device according to claim 1; and
   a controller that controls a moving body equipped with the steering apparatus, based on a detection result of the pressure detection device.

10. A method of detecting pressure, comprising the steps of:
    (a) providing a buffer member that is deformable by a pressure change, the buffer member including a plurality of the magnets in an evenly dispersed arrangement which are spaced apart from one another; and
    (b) detecting a variation of a magnetic field accompanied by deformation of the buffer member, to detect a pressure applied to the buffer member.

11. A pressure detection device, comprising:
    a buffer member deformable by a pressure change, the buffer member including a plurality of the magnets which are spaced apart from one another; and
    a sensor assembly including one or more magnetic sensors to detect a variation of a magnetic field accompanied by deformation of the buffer member,
    wherein the buffer member surrounds the sensor assembly.

12. A pressure detection device, comprising:
    a buffer member deformable by a pressure change, the buffer member including a plurality of the magnets which are spaced apart from one another; and
    a sensor assembly including one or more magnetic sensors to detect a variation of a magnetic field accompanied by deformation of the buffer member,
    wherein the buffer member is thick relative to the sensor assembly, and made of a buffer material that deforms to absorb an external shock or vibration.

13. The pressure detection device according to claim 12 wherein the buffer material comprises sponge or polyurethane foam.

* * * * *